(12) United States Patent
Dartois

(10) Patent No.: US 6,774,834 B2
(45) Date of Patent: Aug. 10, 2004

(54) METHOD AND APPARATUS FOR PREPARING SIGNALS TO BE COMPARED TO ESTABLISH PREDISTORTION AT THE INPUT OF AN AMPLIFIER

(75) Inventor: Luc Dartois, Carrieres sous Poissy (FR)

(73) Assignee: Evolium S.A.S., Paris (FR)

( * ) Notice: Subject to any disclaimer, the term of this patent is extended or adjusted under 35 U.S.C. 154(b) by 0 days.

(21) Appl. No.: 10/345,222

(22) Filed: Jan. 16, 2003

(65) Prior Publication Data

US 2003/0156658 A1 Aug. 21, 2003

(30) Foreign Application Priority Data

Jan. 21, 2002 (FR) .............................. 02 00696

(51) Int. Cl.⁷ .............................................. H03M 1/66
(52) U.S. Cl. .................... 341/144; 341/120; 341/118
(58) Field of Search .............................. 341/143, 144, 341/155, 118, 120

(56) References Cited

U.S. PATENT DOCUMENTS

| 5,049,832 A | * | 9/1991 | Cavers | 330/149 |
| 5,905,760 A | | 5/1999 | Schnabl et al. | 375/296 |
| 6,359,508 B1 | * | 3/2002 | Mucenieks | 330/149 |
| 6,566,966 B1 | * | 5/2003 | Bellaouar et al. | 331/10 |

FOREIGN PATENT DOCUMENTS

WO    WO 99/57806 A1    11/1999

* cited by examiner

*Primary Examiner*—Peguy JeanPierre
(74) *Attorney, Agent, or Firm*—Sughrue Mion, PLLC (57) ABSTRACT

The invention relates to a method of preparing signals (X and Y) to be compared to establish predistortion at the input of an amplifier (12), the signals comprising a signal (X) before amplification and a signal (Y) after amplification by said amplifier. Preparation includes time aligning (22) the signal before amplification (X) with the signal after amplification (Y) before using them to establish said predistortion. The invention preferably operates in two stages, namely a stage of coarse time alignment, in which the signal before amplification (X) is subjected to a time delay comprising an integer number of first time units, and a stage of fine time alignment, in which a delay or advance value of a fraction of the first time unit is determined.

29 Claims, 4 Drawing Sheets

METHOD AND APPARATUS FOR PREPARING SIGNALS TO BE COMPARED TO ESTABLISH PREDISTORTION AT THE INPUT OF AN AMPLIFIER

The field of the invention is that of signal processing, more specifically in the context of correcting distortion produced by an amplifier system. Correction involves comparing the characteristics of the output signal with the original signal at the input of the amplifier system in order to determine the distortion that the system produces. This makes it possible to respond by calculating inverse predistortion to be applied to the input signal to cancel the distortion and thereby improve the linearity and the electrical efficiency of the amplifier system.

The invention is based on the observation that, because the amplifier system introduces a time-delay, the comparison is not applied to the signal and to its exact replica (ignoring the intrinsic distortion of the system), and that this leads to non-negligible error and puts a theoretical limit on how well predistortion can be calculated.

BACKGROUND OF THE INVENTION

Existing predistortion techniques do not address this problem of error associated with the time-delay between the signals compared.

Because the signals are generally compared using digital techniques, it is necessary to digitize at least the analog output signal of the amplifier system. The digitized output signal at a given time t0 is the replica, distorted to a greater or lesser degree by the amplifier, of the signal on the input side of the system at time t0-δ, where δ is the time-delay caused by the system.

Note further that the time-delay is not fixed, and can vary with aging of the system, its temperature, the amplified signal, the power, the frequency band used, etc., which makes correction by applying a single fixed time shift to the comparison signal (reference signal) from the input side of the amplifier system somewhat ineffective.

Figure 1:
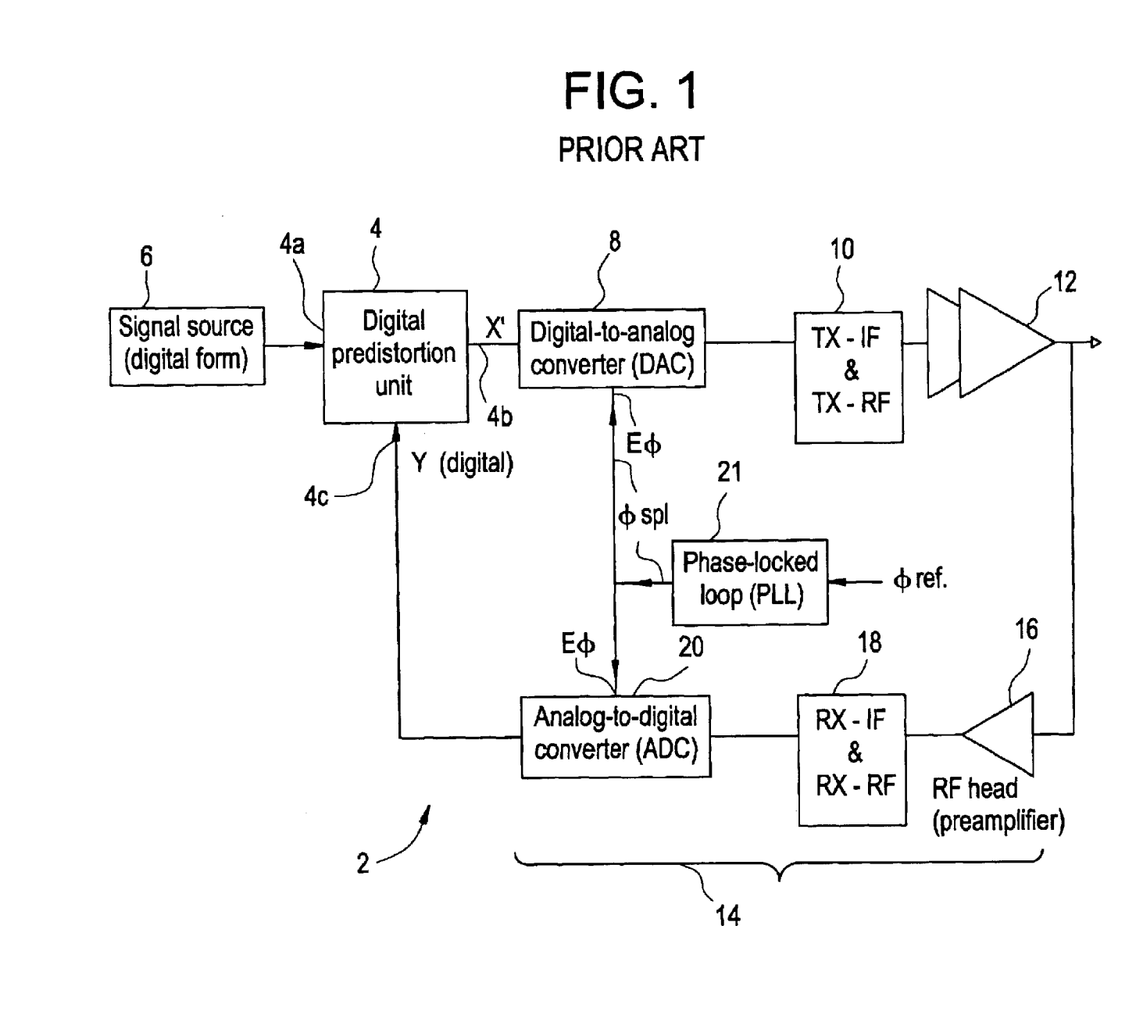
FIG. 1, already described, is a simplified block diagram of a transmission system with power amplification employing correction of nonlinearity by a prior art digital predistortion unit.

FIG. 1 is a simplified diagram of the main components of a conventional amplifier system for a radio transmitter in which nonlinearity is corrected by predistortion. The system 2 includes a digital predistortion unit 4 which receives a digital signal X to be amplified at a first input 4a, in this instance from a digital modulation source 6. The unit 4 adds predistortion to the digital signal X, thereby modifying it to produce a predistorted signal X' at the unit's output 4b. The signal X' is then converted into analog form by a digital-to-analog converter (DAC) 8 whose output feeds a transmit frequency converter stage (TX-IF and TX-RF) 10 which drives the power amplifier 12, which is connected to a transmit antenna (not shown).

To make the comparison, the output signal Y of the power amplifier 12 is fed back via a loop 14 to a second input 4c of the predistortion unit 4. The loop includes a radio frequency (RF) head 16 whose input receives the output signal of the power amplifier 12 and supplies it in a suitable form to a receiver frequency converter stage (XR-IF and XR-RF) 18 whose function is the inverse of that of the converter stage 10 (even if the intermediate frequencies are not the same). The output of the converter stage 18 is digitized by an analog-to-digital converter (ADC) 20 which supplies the digitized signal Y to the second input 4c of the predistortion unit.

The DAC 8 and the ADC 20 are clocked by a signal Φ spl at respective clock inputs EΦ. The signal Φ spl fixes the period of each conversion of the instantaneous digital value of the signal X for the DAC and the period of each digitization of the instantaneous analog value of the signal detected at the output of the power amplifier 12, i.e. the sampling rate. In this example, the signal Φ spl is supplied in common to the DAC 8 and the ADC 20 by a phase-locked loop (PLL) 21 fed by a reference clock Φ ref.

Note that the signals X and Y compared by the predistortion unit are subject to varying time shifts which can exceed the period of the clock Φ spl and whose exact values do not correspond to an integer number of periods of that clock.

In the prior art, the base band output Y from the ADC 20 is compared directly to the signal X, with no further precautions.

This results in limitations on performance caused both by the intrinsic calibration in the factory of phase alignment and most importantly of sampling time alignment between sending (sampling in the DAC 8) and receiving (sampling in the ADC 20), and also by inherent propagation times in the system, which are non-negligible and liable to vary, in particular because of the presence of analog filters. Although the time shifts for the digital signals can be controlled, the problem is much more difficult in the analog domain.

This defective time alignment is particularly prejudicial to obtaining good predistortion performance at reasonable cost in modern transmitter stations, such as those used in third generation cellular systems. These systems use code division multiple access (CDMA) coding at the radio interface. For reasons of cost and size, the base transceiver stations (BTS) use only one transmit radio power amplifier 12 to transmit the signals of all users on one or more carriers. In this context, the term "transmission" refers to the complete transmission system in the base transceiver station, which includes the digital information and signal processing part and the purely analog part including in particular the power amplifier; the term "radio" refers to the part where radio emission proper takes place which comprises the last link of the chain.

The error in the predistortion calculated by this time shift could be corrected using algorithms, but this would require expensive calculation resources and would be based on approximations and extrapolations that would impose a fundamental limitation on accuracy.

Optimum use of new predistortion techniques allied with peak limiting techniques can achieve power amplifier efficiencies up to 15% to 17%.

This represents a significant advance over conventional amplification techniques known as "feedforward" techniques, the efficiency of which is limited to around 8%. Also, it reduces costs and substitutes digital processing for the complex techniques used in the high power radio frequency and analog stages.

However, to accommodate the many different types of power amplifier and transistor available, and to minimize, or even eliminate, calibration in the factory, the predistortion system must be adaptive so that it can act dynamically to track and correct changes in the transfer function of a power amplifier, especially variations in nonlinearity over the frequency band, in the number of carriers, in temperature, in aging, in memory effects (remanence), etc.

The best and fastest methods are based on conversion tables which construct the inverse of the nonlinearity of a power amplifier and apply it to the modulation signal to reproduce at the power amplifier output the required original signal with the best spectrum masking on adjacent channels.

However, and whichever variant is employed, the algorithms used to update the predistortion table are based on very linear wideband receivers producing a good copy of the radio signal as transmitted. Updating the predistortion table is based on comparing the incoming signal and the outgoing signal, that is to say on the correlation between the incoming signal and the outgoing signal. The greater the radio transmit band and the greater the band to be linearized (at least three to five times the instantaneous transmission band), the more directly is linearization gain linked to the accuracy of the comparison. Most of these methods, based on least mean squares (LMS) algorithms, are relatively insensitive to the quadrature and the gain of the signals to be compared. However, the major problem is the accuracy of the time-delays between the signals compared. In fact, the problem is in all regards identical to that of wideband time-delay locking for a "feedforward" amplifier, except that it occurs in the digital domain in the case of predistortion. In this case, the difficulty of the problem increases as the width of the band to be linearized increases. In practice, to obtain an improvement in linearity of the order of 25 decibels (dB) for an UMTS amplifier for three or four carriers in a 60 megahertz (MHz) band, the time shift between the transmitted and measured signal samples must not exceed 10 picoseconds. Because of even greater variations in clock phase drift and variations throughout the transmit and receive system, this accuracy cannot be obtained by calibration in the factory.

The problem to be solved is that of finding methods for tracking and measuring time alignment dynamically and for correcting it using simple means that are preferably based on low-cost digital techniques.

A high-efficiency transmitter is used in the prior art, with peak limiting and digital predistortion in tandem. The best-known digital predistortion techniques are based on time control, i.e. a highly linear wideband receiver, and preferably use undersampling at the intermediate frequency (to prevent DC component and quadrature and gain pairing defects) to feed LMS algorithms for updating the predistortion table.

Disturbance of time alignment by signal level, gain or quadrature (in the complex plane) mismatches between the two signals to be compared is prevented. The proposed methods are not directly sensitive to the gain difference between the signals X and Y (see FIG. 1). The same applies to quadrature defects.

LMS algorithms are able to take account of phase rotation and the gain difference between the measured signal and the signal to be transmitted. This applies a constant complex value to all the complex coefficients in the predistortion table. This kind of constant value, and in particular the gain component, can be detected and eliminated given that, at the lowest transmitted power, the gain correction must normally be unitary (modulus of the first values in the predistortion table).

Some variants of the above methods can improve performance or simplify implementation, including:
the simplified (clipped) LMS technique, which reduces some complex multiplications for updating coefficients at the sampling rate to sign multiplications, without reducing the rate of convergence or the accuracy of linearization, and
two-dimensional predistortion to address wideband problems, such as nonlinearities that vary with the instantaneous frequency of the signal or the power of the samples previously amplified (short-term thermal memory effect).

In all cases, the algorithm is sensitive to shifting of the DC component, which must be eliminated. This task can be effected easily by a simple narrowband filter if a baseband ADC is used in the receiver.

In the prior art, the problem of correct alignment between the input signal and the measured signal has not been addressed, as a result of which the alignment is limited to ±½ sample and the measured signal difference error is reduced only by the ADC using the highest possible sampling rate and thus minimizing the shift error. At present, with approximately 80 MSPS and a signal bandwidth of 15 MHz, the limitation in the adaptive linearization gain is in the range from 12 dB to 15 dB.

Another method known in the art which can be envisaged if a good metric is available for measuring the time shift consists of delaying the source signal in a programmable manner to lock it onto the signal from the measurement receiver. A programmable filter is then used whose gain curve is flat and whose time-delay is a fraction of the sample time in the required band. This approach is very costly in terms of multipliers (for example Farrow filters, as described in the patent document WO 99/57806), because it operates at the sampling rate.

OBJECTS AND SUMMARY OF THE INVENTION

Given the above problems, an object of the invention is to provide a technique for time alignment of signals having a common origin and which, in one application, can dynamically calibrate and improve predistortion performance, implemented in digital form, in order to improve radio performance and the electrical efficiency of the radio amplifier.

The solution of the invention is both reliable and inexpensive to implement.

To be more precise, a first aspect of the invention provides a method of preparing signals to be compared to establish predistortion at the input of an amplifier, the signals comprising a signal before amplification and a signal after amplification by said amplifier, which method is characterized in that the preparation includes performing time alignment between the signal before amplification and the signal after amplification, prior to using them to establish said predistortion.

The method advantageously comprises:
a coarse time alignment step, in which the signal before amplification is subjected to a time-delay comprising an integer number of first time units and in which the value of the time-delay that produces the delayed signal before amplification having the best time alignment with the signal after amplification is determined, and
a fine time alignment step, in which a delay or an advance value of a fraction of the first time unit to be applied to the sampled signal after amplification producing the best time alignment with the delayed signal before amplification is determined and in which that delay or advance value is applied to the signal after amplification,
the signals time aligned in this way being used to establish said predistortion.

The signal before amplification and the signal after amplification can be subjected to the first time alignment step in digital form.

The delayed signal before amplification having the best time alignment and/or the fraction of the first time unit may be determined by analyzing correlation points between the delayed signal before amplification and the signal after amplification, the delayed signal before amplification having the best time alignment being that which offers the highest correlation points.

The analysis of correlation points may then be applied to a plurality of separate delayed forms of the delayed signal before amplification subjected to the analysis in parallel, the delayed signal before amplification having the best time alignment being selected from the different forms of the delayed signal before amplification.

The analysis of correlation points may be based on the complex representation of at least one of the signals subject to the correlation, for example on the complex representation, i.e. the real and imaginary parts, of the delayed signal before amplification and on only the real representation of the signal after amplification.

In this implementation, the signal after amplification is digitized before the coarse time alignment step at a sampling frequency harmonically related to the sampling frequency of the signal before amplification.

A correlation curve may be defined for the delayed signal before amplification having the best time alignment with the aid of at least three correlation points, of which a first correlation point corresponds to the highest correlation value of the correlation points and the second and third correlation points are on respective opposite sides of the first correlation point, the alignment of the sampling times of the signals in the fine time alignment step being carried out by:

delaying the sampling time of the signal after amplification amplified by the amplifier relative to the delayed signal before amplification if the second correlation point has a lower correlation level than the third correlation point, and advancing the sampling time of the signal after amplification amplified by the amplifier relative to the delayed signal before amplification if the second correlation point has a higher correlation level than the third correlation point, or, conversely, so as to converge towards a substantially equal correlation level between the second and third correlation points.

The correlation may be established taking into account only the signs of the delayed signal before amplification and the signal after amplification amplified by the amplifier and based on calculations of coincidence of signs between the two signals.

The signal after amplification is preferably digitized at a controlled phase sampling frequency, the fine time alignment step varying the sampling phase selectively to increase the time alignment of the delayed signal before amplification having the best time alignment and said signal after amplification amplified by the amplifier.

The first phase controlled sampling frequency may be produced at the output of a first phase-locked loop and the variation obtained by varying in an impulse fashion the reference frequency of that loop.

The reference frequency of the first phase-locked loop is advantageously produced by means of a second phase-locked loop, after division of its output frequency by a variable division number, and the variation of the reference frequency of the first phase-locked loop produced by changing the number to obtain said alignment of the phases of the delayed signal before amplification having the best time alignment and the signal after amplification.

The signal before amplification may be subjected to digital-to-analog conversion before it is fed to the input of the amplifier and the conversion process may be clocked by a sampling signal produced at the output of the second phase-locked loop.

A second aspect of the invention provides apparatus for preparing signals intended to be supplied to predistortion means operating at the input of an amplifier, the signals comprising a signal before amplification and a signal after amplification amplified by the amplifier, which apparatus is characterized in that it includes means for time aligning the signal before amplification with the signal after amplification.

The optional aspects of the invention defined in the context of the method (first aspect) apply mutatis mutandis to the apparatus (second aspect).

A third aspect of the invention provides an amplifier system including an amplifier and predistortion means accepting input signals for comparison respectively before and after distortion by the amplifier, which amplifier system is characterized in that it includes time alignment apparatus according to the second aspect of the invention supplying the input signals for comparison.

The amplifier system can be used for linear power amplification in a wideband radio transmitter, for example in a band established on a frequency of the order of 10 MHz to 100 MHz, for example 60 MHz, and used to transmit multiple-carrier signals, for example for code division multiple access (CDMA) transmission for mobile telephones.

BRIEF DESCRIPTION OF THE DRAWINGS

The invention will be better understood and the resulting advantages will become more clearly apparent on reading the following description of preferred embodiments of the invention, offered by way of non-limiting example only; description refers to the accompanying drawings, in which.

MORE DETAILED DESCRIPTION

Figure 2:
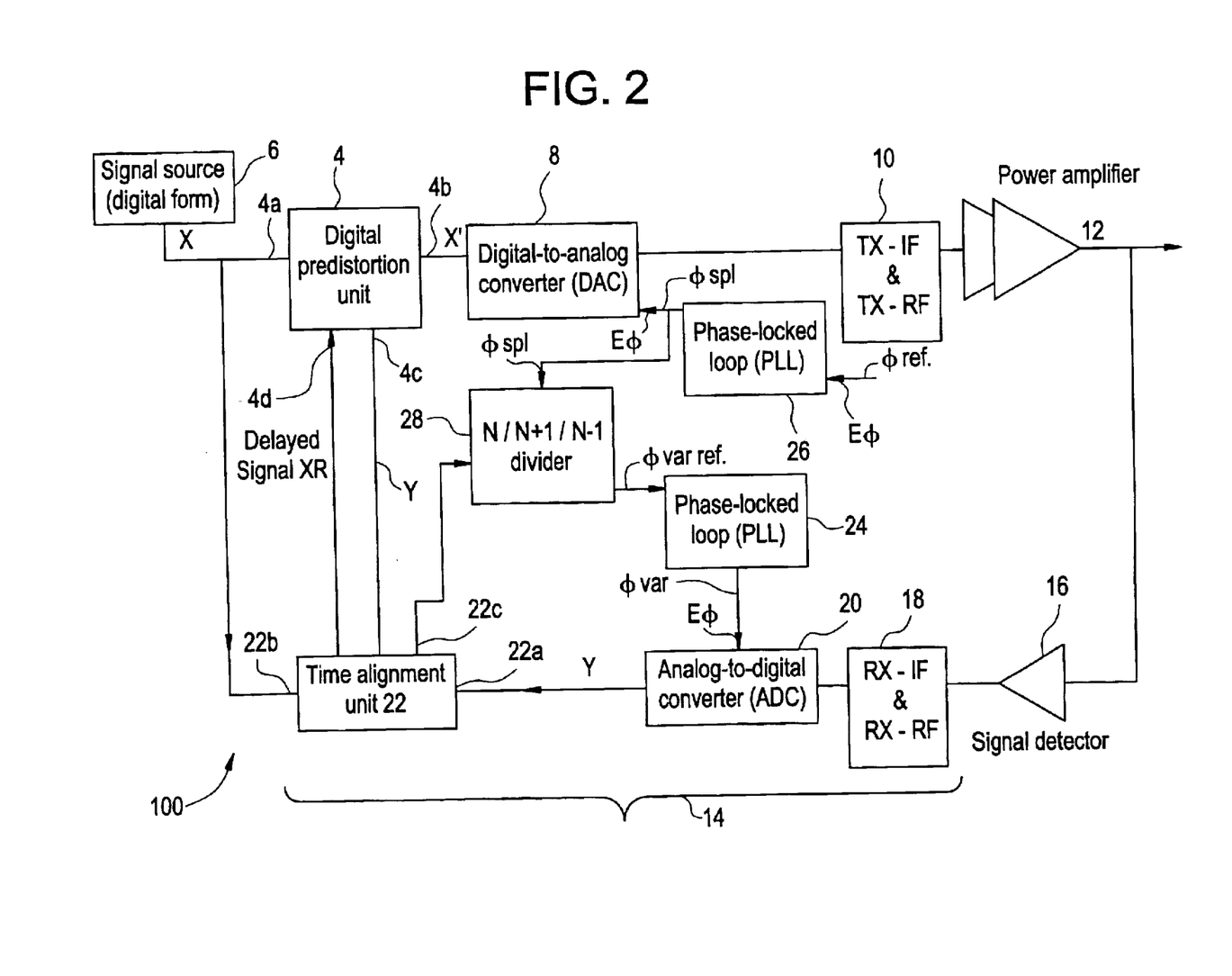
FIG. 2 is a block diagram of a transmission system similar to that shown FIG. 1, but further comprising means for time aligning signals on the input side of the amplification system of the present invention with signals after amplification.

FIG. 2 shows an embodiment of the invention in the context of an amplifier system employing predistortion. In this figure, for conciseness, items analogous to those of FIG. 1 carry the same reference numbers and are not described again.

In this example, the digital signal source 6 of the system 100 produces a composite signal made up of a plurality of codes and frequencies, for example conforming to the 3GTP UMTS standard. In this case, a carrier consists of superposed orthogonal codes each carrying the information for one user. In modern techniques, it is desirable for there to be only one transmission system 100, and thus one amplifier system, for a given antenna sector or station. This implies that the same amplifier system be used not only for all the users on the same carrier but also for more than one carrier on the common radio site. One of the problems raised by this approach stems from the fact that each carrier is a signal that does not have a constant envelope. Since a plurality of users are superposed, the instantaneous power of the signal varies greatly, unlike in conventional constant envelope frequency or phase modulation, in which the instantaneous and average powers are always equal. This makes it necessary to uprate the power amplifier 12 to obtain usable linearity even before nonlinearity correction, which leads to additional installation and power consumption costs. The phenomenon is accentuated if a plurality of carriers are processed simultaneously, since that increases the maximum peaks of the resultant signal for a set of carriers simultaneously close to their respective peaks.

The digital signal X from the source 6 enters the digital predistortion unit 4 from which it emerges in the form of the predistorted signal X' which is fed to the input of a digital-to-analog converter 8 (or possibly two such converters, depending on whether conversion is effected in the base band or at the digital intermediate frequency). The analog form of the signal X' at the output of the converter is then subjected to one or more stages of frequency conversion (TX-IF and TX-RF) in the intermediate frequency and radio frequency stage 10, and is fed to the input of the power amplifier 12 that drives the transmitter antenna.

Dynamic control of predistortion uses a feedback loop 14 to a measurement system from the output of the power amplifier. The system includes an analog directional coupler 16 taking a fraction of the amplifier output signal, and providing directional protection against same frequency band signals picked up by the antenna and also providing impedance matching. The coupler 16 drives a frequency changer stage 18, which corresponds to a receiver effecting conversion (XR-IF and XR-RF) that is the inverse of the conversion effected by the stage 10 on the input side of the power amplifier. Once its frequency has been changed, the signal is digitized by an analog-to-digital converter (ADC) 20, preferably at the intermediate frequency level and using undersampling techniques. The ADC then has a dual function: firstly, because of undersampling, it extracts from the replicas of the signal, that replica which is in base band (first Nyquist area), which corresponds to a change of frequency and, secondly, it delivers this base band replica in digitized form.

In accordance with the invention, the output Y of the ADC 20 is processed by a time alignment unit 22 before it is fed to the second input 4c of the digital predistortion unit 4. The time alignment unit 22 adaptively eliminates errors in the time alignment of the signal Y relative to the signal X from the source 6 (and fed to the respective input 22a), so as to track system propagation time drift and changes such as are caused, for example, by temperature variations, aging, conditions of use, etc. In this case, the phase and time shifts between the signals X and Y are learned dynamically, so that the samples can be digitally realigned and so that comparison can be carried out under optimum conditions in the digital predistortion unit 4.

The time alignment unit 22 operates in two stages:
  a first stage of coarse time alignment, in which the signal before amplification (X) is subject to a time-delay comprising an integer number of first time units, and in which the time-delay that produces the delayed signal before amplification (XR) having the best time alignment with the signal (Y) sampled and digitized after amplification is determined, and
  a second stage of fine time alignment, in which the delayed signal before amplification (XR) having the best time alignment is compared to said signal (Y) after amplification from the amplifier, and in which the signals after fine time alignment are used to establish the predistortion.

In the first stage, the time alignment unit produces delayed replicas XR of the signal X with different time-delays. The increment between successive time-delays can correspond to a first unit, which is typically a sampling period of the signal X' at the level of the DAC 8. Each replica is available for comparing its time alignment with the signal Y. The time alignment unit 22 then determines which of the delayed signal replicas XR has the time-delay closest to that caused by the amplification system 12. This phase produces a first time correlation approximation with a gain—or an accuracy—equal to ±0.5 times the first time unit. The replica XR having the best time alignment with the signal after amplification (Y) is then fed to the comparison input (third input 4d) of the digital predistortion unit 4. In comparison with the FIG. 1 (prior art) diagram, the digital predistortion unit 4 no longer uses as the basis for comparison the signal X from the source 6 fed to the first input 4a, but instead uses the signal XR fed to the third input 4c. Note, however, that this first input 4a is still used to apply the signal from the source 6 that is intended to receive the predistortion.

The second stage shifts the sampling time of the signal Y in order to align it with that of the replica XR with the best time alignment. To do this, the time alignment unit 22 modifies the phase $\phi$ var of the periodic sampling signal applied to the sampling clock input E$\phi$ of the ADC 20, which is then variable.

The variable phase of the sampling signal $\phi$ var requires that the sampling signal be produced separately from the sampling signal for the DAC 8, which must be of constant phase and frequency, whilst maintaining perfect long-term frequency control between the two signals. Two PLL clock circuits 24 and 26 are therefore provided and supply the sampling signal to the ADC 20 and to the DAC 8, respectively.

In this example, the phase of the sampling signal $\phi$ var of the ADC 20 is varied by varying the frequency of the reference signal $\phi$ var.ref of its PLL 24. Because of its loop filter, the PLL circuit acts as an integrator such that a pulse at a frequency around the nominal value N of the divider causes a phase shift of $\phi$ var. This variable reference signal $\phi$ var.ref is produced at the output of an N/N+1/N−1 divider 28 whose division value N, by which the frequency is varied, is programmable from an output 22c of the time alignment unit 22, given that the average value under steady state conditions is always N.

The clock signal at the input of the divider 28, which constitutes the source of the signal $\phi$ var.ref, is the sampling signal $\phi$ spl of the DAC 8 produced by the PLL 26. The following condition therefore applies: frequency of $\phi$ var.ref=frequency of $\phi$ spl/N.

Accordingly, fine alignment is obtained by proportionately shifting the phase of the signal $\phi$ var of the ADC 24 by changing the phase of the reference clock $\phi$ var.ref of its PLL, providing a phase lock between the clocks of the two converters 8 and 20.

The sampling frequency at the ADC 20 can typically be of the order of 100 MHz, or even more. This necessitates sampling clocks with good spectral purity, obtained from a PLL having a reference clock which provides a time reference and ensures filtering and spectral purity.

It is therefore advantageous to use as a reference for the PLL 24 of the ADC 20 a signal from the divider which is driven by the output of the PLL 26 of the DAC 18, since this obtains high accuracy because a high-frequency input provides higher accuracy and speed of fine time alignment for a value N−1 or N+1 of the divider 28.

To provide a relatively fine increment for the control of this reference, a fast clock is used, which usefully supplies the PLL 26. The absolute adjustment accuracy remains in the digital domain. However, the phase is controlled continuously because there is a PLL 24 with a loop filter. There is therefore no limit caused by absolute quantization in the adjustment at the level of the PLL 24. The only limitation caused by the maximum value N+1 of the divider is in the instantaneous correction, in other words in the frequency changer pulse to be injected, linked to the value of the divider. The higher the divider value N, the finer the increment, and the easier it is for the PLL to perform the necessary filtering, although on the other hand the convergence time is commensurately longer. The compromise to be achieved is between the convergence time and the residual noise when the loop is locked.

Note that for reasons of simplicity, cost and implementation, the signal Y at the output of the measurement receiver and the ADC can be undersampled compared to the signal X from the source. In contrast, and because of the predistortion principle, the signal X is oversampled relative to the bandwidth of the signal to be transmitted in order to control high harmonics in phase opposition. This implies a wide bandwidth, the sampling frequency being greater by a factor of 5 or 7 than the bandwidth to be transmitted, for example. However, this embodiment of the invention also reduces the constraints on the sampling rate for the signal Y and therefore reduces the cost of the ADC 20 and the calculation costs in the time alignment unit 22. What is important is essentially the accuracy of the sampling time and the amplitude of the sample of the signal Y. The less frequently the signal Y is sampled, the longer it takes to learn the predistortion, because the rate of convergence of the predistortion tables is linked to the total quantity of information sampled and used from the signal Y.

The functional components of the time alignment unit for carrying out the above two steps are described in more detail next with reference to FIGS. 3 and 4.

Figure 3:
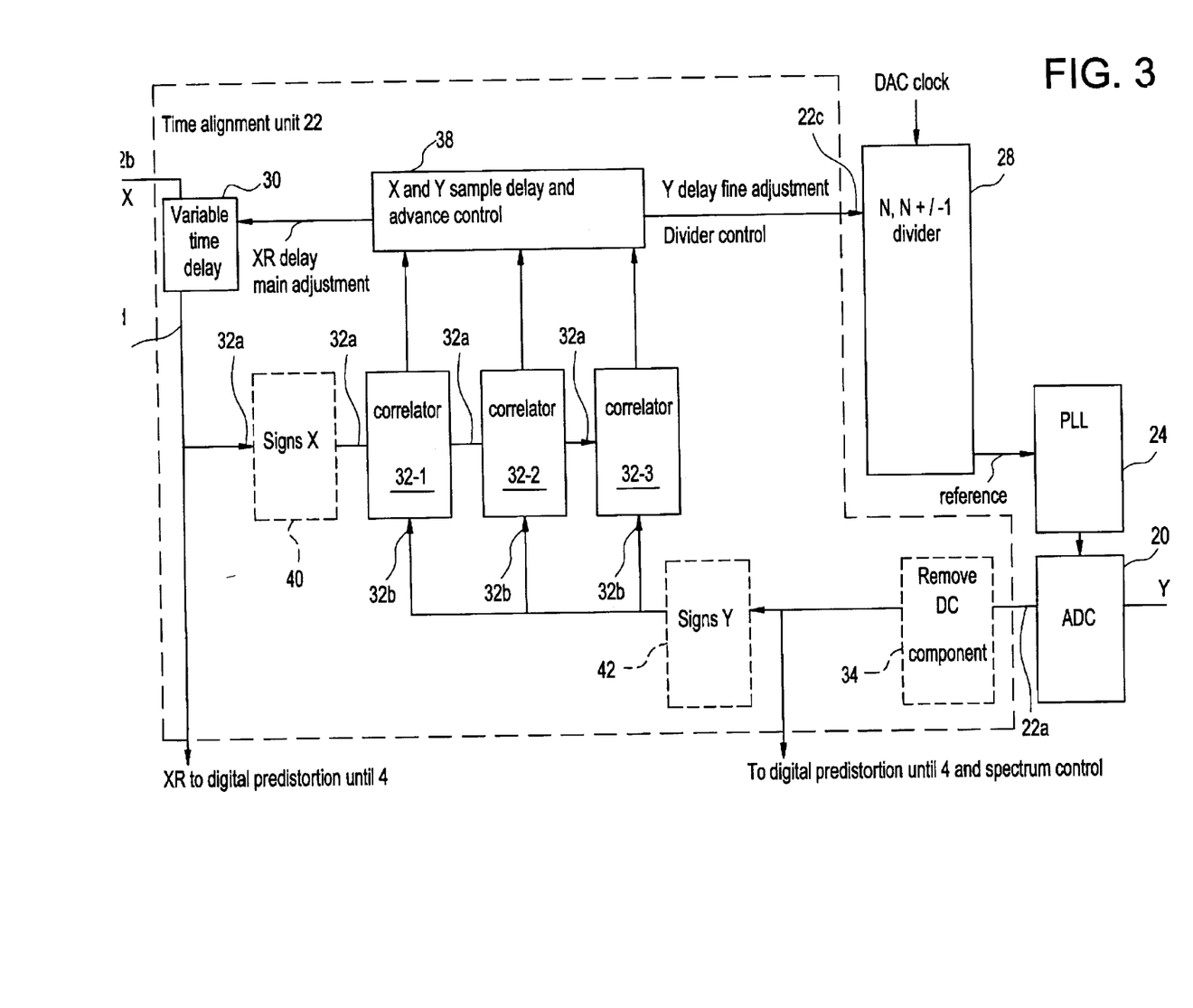
FIG. 3 is a block diagram of the time alignment unit of FIG. 2 and the components of the system that it controls.

As shown in FIG. 3, the input 22*b* of the time alignment unit 22 which receives the digital signal X from the source 6 is that of a device 30 for applying a time-delay that can be varied in increments of an integer number of samples of the signal, this device consisting of a variable number of shift registers, for example. The increment therefore corresponds to the above-mentioned first time-delay unit. The time-delay imposed on the signal X in this way is made at least equal to the maximum time-delay caused by the amplification and measuring system that produces the signal Y. The time-delay device 30 supplies three signal replicas XR to a respective first input 32*a* of three correlators 32-1, 32-2 and 32-3, each with a different time-delay, for example by feeding them from respective lateral outputs of the shift register. The time interval between the successive time delays supplied to the correlators is greater than two sampling periods of the ADC 20 for an average value of the signal φ var in the fine alignment mode.

Thus the three correlator operate in parallel, supplying three correlation points at any given time. More correlation points can be obtained by having them operate in parallel-serial mode, whereby an operation of obtaining three correlation points is repeated with three new time-delay values, thereby providing a multiple of three correlation points. The number of correlators used is arbitrary, of course.

The numbers of correlation points established in this way can be different in the first (coarse alignment) stage and the second (fine alignment) stage.

The output Y of the ADC 20 is supplied in parallel to a respective second input 32*b* of each of three correlators (generically designated 32).

Each correlator then establishes the correlation between the signal Y and the time-delayed signal XR with the time-delay specific to it, enabling working in parallel with three (or more) consecutive shift hypotheses in the coarse alignment phase.

It will be remembered that the modulus or the power of correlation of two signals, in this instance the signals Y and X, is a function of the shift between the two signals which gives a metric of the resemblance of the signals for each alignment tested. In the sampled mode, as is the case in the embodiment described here, a correlation point P(k) (see FIG. 4) is the sum of the cross products of the shifted samples of the signals X and Y, that is to say, if the correlation is limited to a finite time support with a length of N samples:

$$P(k)=X(0)\times Y(k)+X(1)\times Y(k+1)+ \ldots +X(n)\times Y(k+n)$$

In the case of complex signals X and Y, the correlation point P is a complex function of the shift $\underline{k}$ between the streams X and Y, whose modulus represents the correlation power and whose phase represents the average phase rotation in the signals X and Y.

More particularly, correlations compare the real or complex representation of the signal Y to the complex signal X transmitted with different imposed time-delays, so that the correlation peak is inside the window of the correlator (at least three or five points, spaced by one sampling period).

During this search, the correlation points obtained from the correlators are extracted. In FIG. 4, there are five of these correlation points, for example, constituting a selection from six correlation points extracted from parallel-serial operation of the three correlators 32-1, 32-2 and 32-3 from FIG. 3, each of which produces two correlation points for two respective time shift values.

The comparison is effected by comparing the square of the moduli of the correlation points concerned.

From the replica of the delayed signal XR before amplification of the sample which gives the correlation maximum, the process moves on to the second stage, which operates on the hybrid (analog and digital) system to correct the phase of the sampling clock φ var to perform the interpolation in the analog domain and therefore at low cost.

More particularly, the programmable divide-by-N circuit 28 which controls the differentiator/integrator effect of the PLL is locked using a closed loop, so that the interpolation, operating on the clock shift, is not effected using an open loop.

Figure 4A:
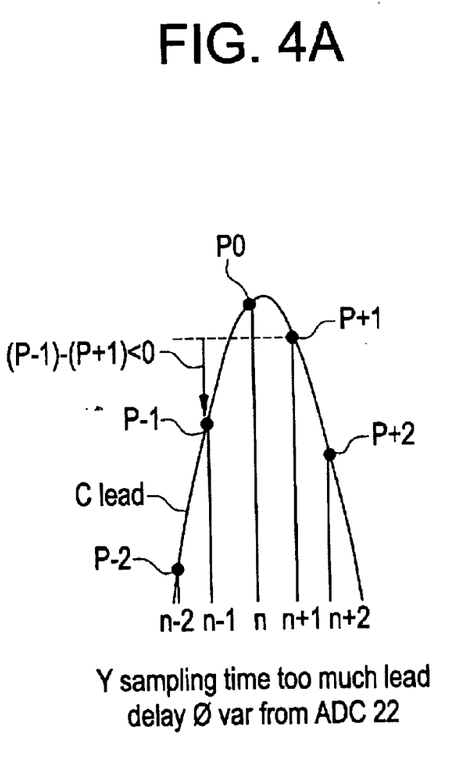
FIGS. 4a, 4b and 4c are diagrams showing the correlation between the amplification system signals on the input side and after amplification enabling their time alignment to be adjusted finely.
Figure 4B:
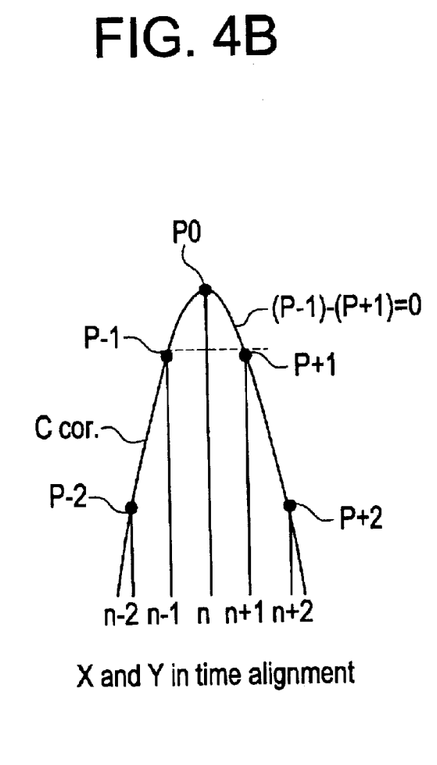
Figure 4C:
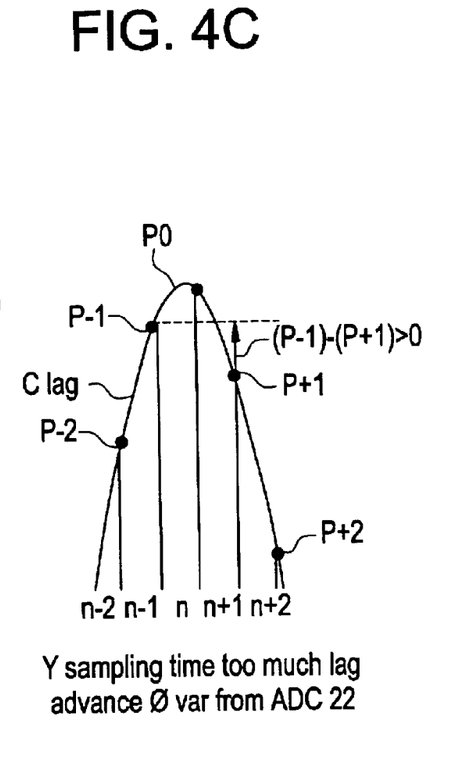

It has been verified that the wide horizon correlation curve is bell-shaped with a sign relationship. The width of the bell and its slope depend on the quantizing of X and Y (signs only or also mantissa) and on the type of modulation, the number of carriers and the bandwidth of the signal. This phenomenon is shown in FIGS. 4*a*, 4*b* and 4*c*, in which:

FIG. 4*a* represents a correlation curve Clag. for a sampling time of the signal Y that is too far advanced, which requires the signal φ var to be delayed, FIG. 4*c* represents a correlation curve Clead. for a sampling time of the signal that is lagging too far, which requires the signal φ var to be advanced, and FIG. 4*b* represents a correlation curve Ccor. for time aligned signals, i.e. signals for which the fine locking has been done.

These curves are produced from correlation points P×conjP that are homogeneous to a power which is a function of the shift $\underline{k}$ and independent of the phase rotations.

Because the correlation curve is relatively peaky and monotonic on either side of the real peak, the direction of the change of the phase and the frequency of the signal φ var can be determined as a function of the sign of the correlation contrast, i.e. the contrast between the correlation value differences at points (respectively the points P−1 and P+1) immediately to the left and immediately to the right of the measured imperfect maximum (the point P0). In this form of representation, the point P0 corresponds to the best correlation obtained during the first, coarse time alignment stage and the points P−1 and P+1 correspond to the best correlations away from that point P0. Accordingly, with only the information on the sign of the difference between the correlations to the left and to the right of the maximum, the alignment can be made to converge systematically in the right direction, this convergence being obtained by successive steps in which the N−1/N/N+1 counter and the PLL 24 increase/decrease the frequency of φ var.ref and therefore the phase of the sampling clock of the ADC 20.

In FIG. 4a, for example, the correlation point P+1 to the right of the maximum point P0 is closer to the peak of the curve Clag. than the correlation point P−1 to the left of the maximum point, i.e. (P−1)−(P+1)<0, which gives a "negative" correlation sign.

Conversely, in FIG. 4c, the correlation point P+1 to the right of the maximum point P0 is farther from the peak of the curve Clead. than the correlation point P−1 to the left of the maximum point, i.e. (P−1)−(P+1)>0, which gives a "positive" correlation sign.

Of course, the "negative" and "positive" correlation signs must be understood as being relative and fixed by the arbitrary choice of the correlation point (P−1) to the left as the reference point.

The signs produced in this way are periodically detected by the general control unit 38 which determines the division value N, N+1 or N−1 of the counter so as to operate:

by increasing the value N, to reduce the frequency of the signal φ var and thus to delay its phase, for as long as the detected sign is "negative", and by reducing the value N, to increase the frequency of the signal φ var and thus advance its phase, as long as the detected sign is "positive".

This control process continues in looped fashion, with the value N revised each time until the condition of time alignment of the signals XR and Y is obtained, i.e. (P−1)=(P+1) (FIG. 4b). To avoid oscillation or hunting phenomena in the control loop, a range of tolerance around the absolute time alignment can be defined, within which the control unit 38 ceases to modify the value of N, which has the positive effect of opening up the control process for as long as the misalignment is below a fixed threshold and improving the spectrum of the ADC clock, there being no disturbance to the loop 24. In contrast, alignment is locked again only when the shift of the signal Y relative to the signal XR is measurable (i.e. when (P−1)−(P+1) is not equal to zero).

Each change to the value N can be of one or more units, depending on the rate of convergence and the required accuracy, for example, up to N−2 and N+2.

It has been verified that the control loop for the value N converges well even if the predistortion is poorly calibrated, i.e. if the amplifier saturates and is subject to intermodulation, and that the signals XR and Y are accordingly less correlated and the correlation curve is slightly flatter and noisier.

A simplified but very effective application consists of systematically calculating the three correlations on a horizon of N or N−1 samples and aligning this correlation window on the count of the N/N−1/N+1 divider.

The fine alignment loop is a time-locked loop and is capable of tracking delays in the window of ±0.5 sample (and even up to virtually ±1 sample), which in the case of strong variations avoids coarse locking being altered by the main time-delay unit 30. In parallel with this, the correlation peak among the selected three correlation points is tracked to assure convergence and to reactivate step 1 of the main locking process if necessary.

The complex-complex correlation of the two signals XR and Y compared circumvents any fixed gain and difference between the two signals, especially as the correlation powers are compared.

Using only a real representation of the signal Y can nevertheless be envisaged, to simplify the correlators 32 by halving the sensitivity of the detector of the correction direction, but without creating any ambiguity as to the decisions or any risk of divergence, provided that XR remains complex.

Thus the direct output of the ADC 20 can be used for correlation without converting it into a complex signal, which makes even more beneficial the natural undersampling at the intermediate frequency with only one real ADC.

This simplification of the correlators 32 increases the convergence time to a few tens or hundreds of milliseconds, but is still compatible with an initial calibration time that is short compared to the time for starting up the system and the slow variations caused essentially by thermal variations and aging.

If necessary, the signal Y at the output of the ADC 20 can have the DC component suppressed by the unit 34 shown in dashed outline.

After treatment by the time alignment unit 22, the signal Y is therefore time aligned with the signal XR. The aligned signal Y is then fed to the comparison input 4c of the digital predistortion unit 4 (see FIG. 2), on the same terms as the signal XR, which is supplied to a third input 4d of the unit.

In a variant of the above embodiment, the correlators can be simplified and the correlation values normalized by considering only the arithmetical sign of the signals XR and Y. To this end, first and second sign detector units 40 and 42 are provided on the input side of the first and second inputs 32a and 32b, respectively, of the correlators 32. Because they are optional, the units 40 and 42 are shown in dashed outline. This variant is restricted to values of coincidence between the signals XR and Y, i.e. the sign detector units 40 and 42 limit themselves to sampling the sign of the signals. In standard digital representation, this operation advantageously amounts to "2's complement" calculation, taking only the most significant bit, which represents the sign. In the case of a complex signal, this operation is applied independently to the components I and Q, which amounts to representing the signal concerned by four values that correspond to the respective corners of a square: 1+j, 1−j, −1+j and −1−j.

Of course, any intermediate solution in which the representation of the values of the signals XR and Y is truncated or rounded can be envisaged.

Obviously the complexity and the dynamic range of the correlators tracks that of the signals XR and Y on the output side of the sign detection units 40 and 42.

Although the above embodiments of the invention can be reduced to practice with many predistortion techniques known in the art, those with which it is particularly advantageous are of the adaptive wideband receiver class, such as LMS algorithms, in which predistortion tables are updated and learned by real time comparison of the signal transmitted and received for each sample transmitted and received (or for each sample received if the ADC is running at a frequency that is a subharmonic of the data stream of the signal X).

By means of the invention, these parameters cooperate positively, and predistortion and calibration of the learning tables can be carried out in parallel and continuously. The robustness of the technique of the invention ensures that calibration is achieved even when the system is started up and all memory of predistortion has been lost, so that the power amplifier 12 is in a regime close to saturation. There is therefore no need for any test signal, since the technique operates "on the fly" on the nominal amplification signal, whether it is weak or strong. This is therefore different from the standard calibration methods which require transmission from the station to be periodically halted in order to inject a test signal that is clearly defined and serves as a calibration reference. The station can therefore remain available at all times.

The process of time alignment and learning by correlation uses only the correlation properties and some degree of correlation symmetry that apply to any signal, and thus also to the wanted transmitted signal of the station.

Note that time alignment and learning interact positively. The more "calibrated", the faster the predistortion tables converge toward the correct value, with a low residual noise floor; reciprocally, the better the predistortion, the more pointed the peak of the correlation curve C (FIGS. 4a–c) and the lower the floor, and the accuracy with regard to the sign becomes much less sensitive to residual intermodulation noise in the amplifier.

The invention has many advantages in an application to amplification with adaptive predistortion, including:

using the existing PLL clock 26 for the transmit DAC 8 and for the receive ADC 20, in which it provides a reference frequency source for the PLL 24 of the ADC;

using only existing transmit and receive digital data for continuous and full calibration without any test signal;

integrating virtually all the additional components digitally and easily on a user programmable logic array (field programmable gate array (FPGA)) or on an application-specific integrated circuit (ASIC), the time calibration functions requiring only a few thousand gates;

the PLL and the counters are also potentially integratable;

it is compatible with any type of digital predistortion with looping in the time domain;

it offers a time alignment accuracy that can be increased when necessary (multiple carriers) because of increased correlation contrast;

it is compatible with simplified correlation solutions: from sign correlation to tabulated multipliers of a few bits.

Note: if correlation is limited to sign correlation, i.e. the signals XR and Y are represented by the signs of their real and imaginary parts, then correlation uses only a set of up/downcounters fed by exclusive OR operators processing the signs. The correlation power is no more than the sum of the squares of the counters.

The advantage of this is that the correlation values are equivalent to rates of coincidence of sign between the signals XR and Y and are insensitive to the relative phase of each signal, and most importantly to the power of each signal. This facilitates controlling the gain of the control loop and makes the correlation curve steeper and less dependent on distortion (in other words, if the power amplifier 12 saturates, changes the sign of Y or its zero-crossing times little, if at all);

because of the moderate speed of the control loop as a whole, it refines and applies the criteria for the loop parameters in software form in a digital signal processor or a microcontroller;

time alignment converges before predistortion is activated or started, because of the robustness of the correlators and the metric used to control the PLL 24 (see above note);

because of the initial alignment by an integer number of sample delays, it avoids the need for any calibration in the factory, even if the total transmit and receive time-delay is unknown or is subject to a variation of more than one period;

the effective time alignment is maintained (by using standardized correlation contrast) even in periods where the power transmitted is low (see above note); and problems of convergence by a correlation curve that is too flat are detected, providing means for protecting the table DPD from updates that are either unnecessary or dangerous because they are subject to misalignment errors.

The invention applies inter alia to all 3G/CDMA multiple-carrier or single-carrier standards. It applies in principle to linearized amplifiers for fixed wireless radio broadcasts up to wideband modulation such as CDMA or OFDM. Thus in this application it advantageously exploits the pseudo-noise and wide band properties of single-carrier and multiple-carrier CDMA signals.

Clearly the invention lends itself to many other variants that do not depart from the scope of the claims, as much with regard to its hardware and functional implementation as to the target applications.

The description is based on an application in the context of an amplification system of a transmitter station using predistortion techniques. However, it is clear that the time alignment teachings of the invention apply to all technical fields that can benefit from time locking of a plurality of signals.

What is claimed is:

1. A method of preparing signals to be compared to establish predistortion at an input of an amplifier, the signals comprising a signal before amplification and a signal after amplification by said amplifier, wherein the method is characterized in that said preparation includes performing time alignment between the signal before amplification and the signal after amplification, prior to using said signals to establish said predistortion, wherein the method further comprises:

a coarse time alignment step, in which the signal before amplification is subjected to a time-delay comprising an integer number of first time units and in which a value of the time-delay that produces a delayed signal before amplification having the best time alignment with the signal after amplification is determined, and a fine time alignment step, in which a delay or an advance value of a fraction of the first time unit to be applied to a sampled signal after amplification producing the best time alignment with the delayed signal before amplification is determined and in which that delay or advance value is applied to the signal after amplification, wherein the signal after amplification and the delayed signal before amplification time aligned in this way are used to establish said predistortion.

2. A method according to claim 1, characterized in that said signal before amplification and said signal after amplification are subjected to said coarse time alignment step in digital form.

3. A method according to claim 1, characterized in that the delayed signal before amplification having the best time alignment and/or said fraction of the first time unit is determined by analyzing correlation points between the delayed signal before amplification and the signal after amplification, said delayed signal before amplification having the best time alignment being that which offers the highest correlation points.

4. A method according to claim 3, characterized in that said analysis of correlation points is applied to a plurality of separate delayed forms of the delayed signal before amplification subjected to said analysis in parallel, the delayed signal before amplification having the best time alignment being selected from the different forms of the delayed signal before amplification.

5. A method according to claim 3, characterized in that said analysis of correlation points is based on a complex representation of at least one of the signals subject to the correlation.

6. A method according to claim 3, characterized in that said analysis of correlation points is based on the complex representation, i.e. the real and imaginary parts, of said delayed signal before amplification and on only the real representation of the signal after amplification.

7. A method according to claim 3, characterized in that a correlation curve is defined for said delayed signal before amplification having the best time alignment with the aid of at least three correlation points of which a first correlation point corresponds to the highest correlation value of the correlation points, and the second and third correlation points are on respective opposite sides of the first correlation point, and in that the alignment of the sampling times of the signal after amplification and the delayed signal before amplification in the fine time alignment step is carried out by:
  delaying the sampling time of the signal after amplification amplified by the amplifier relative to the delayed signal before amplification if the second correlation point has a lower correlation level than the third correlation point, and
  advancing the sampling time of the signal after amplification amplified by the amplifier relative to the delayed signal before amplification if the second correlation point has a higher correlation level than the third correlation point, or, conversely,
  so as to converge towards a substantially equal correlation level between the second and third correlation points.

8. A method according to claim 3, characterized in that the correlation is established taking into account only signs of the delayed signal before amplification and the signal after amplification amplified by the amplifier and is based on calculations of coincidence of signs between the signal after amplification and the delayed signal before amplification.

9. A method according to claim 1, characterized in that the signal after amplification is digitized before said coarse time alignment step at a sampling frequency harmonically related to a sampling frequency of the signal before amplification.

10. A method according to claim 1, characterized in that said signal after amplification is digitized at a controlled phase sampling frequency, said fine time alignment step varying the sampling phase selectively to increase the time alignment of said delayed signal before amplification having the best time alignment and said signal after amplification amplified by the amplifier.

11. A method according to claim 10, characterized in that said first phase controlled sampling frequency is produced at an output of a first phase-locked loop and the variation is obtained by varying in an impulse fashion a reference frequency of that loop.

12. A method according to claim 11, characterized in that said reference frequency of the first phase-locked loop is produced by means of a second phase-locked loop, after division of its output frequency by a variable division number, and said variation of the reference frequency of the first phase-locked loop is produced by changing the number to obtain said alignment of the phases of said delayed signal before amplification having the best time alignment and said signal after amplification.

13. A method according to claim 12, characterized in that the signal before amplification is subjected to digital-to-analog conversion before it is fed to the input of the amplifier and the conversion process is clocked by a sampling signal produced at an output of said second phase-locked loop.

14. Apparatus for preparing signals intended to be supplied to predistortion means operating at an input of an amplifier, the signals comprising a signal before amplification and a signal after amplification amplified by said amplifier,
  wherein said apparatus is characterized in that it includes means for time aligning the signal before amplification and the signal after amplification,
  wherein said apparatus further comprises:
    coarse time alignment means for subjecting the signal before amplification to a time-delay comprising an integer number of first time units and for determining the value of the time-delay that produces the delayed signal before amplification having the best time alignment with the signal after amplification, and
    fine time alignment means for determining a delay or advance value of a fraction of the first time unit to be applied to the sampled signal after amplification producing the best time alignment with the delayed signal before amplification and for applying that delay or advance value to the signal after amplification,
    the signal after amplification and the delayed signal before amplification signals time aligned in this way being fed to said predistortion means.

15. Apparatus according to claim 14, characterized in that the fine and/or coarse time alignment means include means for analyzing points of correlation between the delayed signal before amplification and the signal after amplification amplified by the amplifier to determine the delayed signal before amplification having the best time alignment, defined as that offering the highest correlation points.

16. Apparatus according to claim 15, characterized in that it comprises means for analyzing correlation points on the basis of a complex representation of at least one of the signal after amplification and the delayed signal before amplification subjected to the correlation.

17. Apparatus according to claim 16, characterized in that said means for analyzing correlation points operate on the basis of the complex representation, real and imaginary parts, of said delayed signal before amplification and on only the real representation of the signal after amplification.

18. Apparatus according to claim 15, characterized in that it includes means for defining a correlation curve for said delayed signal before amplification having the best time alignment with the aid of at least three correlation points of which a first correlation point corresponds to the highest correlation value of the correlation points, and the second and third correlation points are on respective opposite sides of the first correlation point, and in that the alignment of sampling times of the signal after amplification and the delayed signal before amplification in the fine time alignment step is carried out by:

means for delaying the sampling time of the signal after amplification amplified by the amplifier relative to the delayed signal before amplification if the second correlation point has a lower correlation level than the third correlation point, and means for advancing the sampling time of the signal after amplification amplified by the amplifier relative to the delayed signal before amplification if the second correlation point has a higher correlation level than the third correlation point, or, conversely, so as to converge towards a substantially equal correlation level between the second and third correlation points.

19. Apparatus according to claim 15, characterized in that it further includes means for detecting a sign of the delayed signal before amplification and of the signal after amplification amplified by the amplifier so that the correlation can be determined taking into account only the signs of the signal after amplification and the delayed signal before amplification and is based on calculations of coincidence of sign between the signal after amplification and the delayed signal before amplification.

20. Apparatus according to claim 14, characterized in that it includes means for digitizing the signal after amplification on an output side of the first time alignment means at a first sampling frequency harmonically related to that of the signal before amplification.

21. Apparatus according to claim 14, characterized in that it includes means for digitizing said signal after amplification at a controlled phase sampling frequency and said fine time alignment means include variation means for varying the sampling phase selectively to increase the time alignment of the phases of said delayed signal before amplification having the best time alignment and said signal after amplification amplified by the amplifier.

22. Apparatus according to claim 21, characterized in that it includes a first phase-locked loop for producing said first controlled phase sampling frequency and the variation means vary a reference frequency of said loop.

23. Apparatus according to claim 22, characterized in that it further includes a second phase-locked loop for producing said reference frequency of the first phase-locked loop by means of a frequency divider dividing by a variable number and said means for varying the reference frequency of the first phase-locked loop change the number to obtain said alignment of the phases of said delayed signal before amplification having the best time alignment and said signal after amplification.

24. Apparatus according to claim 23, characterized in that it further includes means for digital-to-analog conversion of the signal before amplification whose conversion process is clocked by a sampling signal produced at an output of said second phase-locked loop.

25. An amplifier system including one amplifier and predistortion means accepting input signals for comparison respectively before and after distortion by the amplifier, wherein the predistortion means is operating at an input of said amplifier and the signals to be compared comprise a delayed signal before amplification and a signal after amplification amplified by said amplifier, and wherein said amplifier system further comprises a time alignment apparatus which supplies said delayed signal before amplification and said signal after amplification for comparisons, coarse time alignment means for subjecting the signal before amplification to a time-delay comprising an integer number of first time units and for determining the value of the time-delay that produces the delayed signal before amplification having the best time alignment with the signal after amplification, and fine time alignment means for determining a delay or advance value of a fraction of the first time unit to be applied to the sampled signal after amplification producing the best time alignment with the delayed signal before amplification and for applying that delay or advance value to the signal after amplification, wherein the signal after amplification and the delayed signal before amplification signals time aligned in this way being fed to said predistortion means.

26. An amplifier system according to claim 25, characterized in that said system is used for linear power amplification in a wideband radio transmitter.

27. An amplifier system according to claim 26, characterized in that the band is established on a frequency of the order of 10 MHz to 100 MHz, and is used to transmit multiple-carrier signals.

28. An amplifier system according to claim 26, characterized in that the band is established on a frequency of the order of 60 MHz.

29. An amplifier system according to claim 26, characterized in that the band is used to transmit multiple-carrier signals for code divisions multiple access transmission for mobile telephones.

* * * * *